United States Patent [19]
Hoeberechts

[11] Patent Number: 4,691,191
[45] Date of Patent: Sep. 1, 1987

[54] DEVICE FOR SIGNAL PROCESSING AND TARGET PLATE FOR SUCH A DEVICE

[75] Inventor: Arthur M. E. Hoeberechts, Eindhoven, Netherlands

[73] Assignee: U.S. Philips Corporation, New York, N.Y.

[21] Appl. No.: 883,852

[22] Filed: Jul. 10, 1986

Related U.S. Application Data

[63] Continuation of Ser. No. 478,973, Mar. 25, 1983, abandoned.

[30] Foreign Application Priority Data

Apr. 20, 1982 [NL] Netherlands ............... 8201630

[51] Int. Cl.[4] ............................................. H03K 13/00
[52] U.S. Cl. ............................ 340/347 P; 315/8.51; 357/29
[58] Field of Search ............ 340/347 P; 315/8.51; 357/29, 30, 31

[56] References Cited

U.S. PATENT DOCUMENTS

| | | | |
|---|---|---|---|
| 3,445,715 | 5/1969 | Dombreck | 315/8.51 |
| 3,774,168 | 11/1973 | Koo et al. | 315/8.51 |
| 3,937,997 | 2/1976 | Barrett | 315/8.51 |
| 4,005,408 | 1/1977 | Taylor et al. | 340/347 P |
| 4,034,363 | 7/1977 | Etten et al. | 340/347 P |
| 4,227,187 | 10/1980 | McNamara et al. | 340/347 P |
| 4,242,694 | 12/1980 | Koike | 357/30 |

FOREIGN PATENT DOCUMENTS

| | | | |
|---|---|---|---|
| 0580573 | 11/1977 | U.S.S.R. | 340/347 P |
| 0643941 | 1/1979 | U.S.S.R. | 340/347 P |

*Primary Examiner*—Benjamin Dobeck
*Attorney, Agent, or Firm*—Paul R. Miller

[57] ABSTRACT

In an analogue-to-digital converter based on the principle of deflection of an electron beam striking a target plate, the number of diodes in the target plate is doubled. The target plate is covered with a metal pattern in a manner so that a complementary digital signal is available besides the original digital signal. Thus, a faster conversion can be achieved. The metal pattern is extended so that extreme values of the voltage to be converted are also detected in a simple manner.

20 Claims, 4 Drawing Figures

DEVICE FOR SIGNAL PROCESSING AND TARGET PLATE FOR SUCH A DEVICE

This is a continuation of application Ser. No. 478,973, filed Mar. 25, 1983, now abandoned.

The invention relates to a device for converting an analogue input signal into corresponding digital signals comprising an electron source for generating a flat electron beam and deflection plates for deflecting the electron beam dependent upon the input signal, and as a target plate for receiving the deflected electron beam a semiconductor body having at a main surface a first set of radiation-sensitive semiconductor elements which are covered with a first part of a pattern of material substantially opaque to radiation in such a manner that in the radiation-sensitive semiconductor elements a number of digital signals can be produced which represent a number of discrete states of the input signal. The invention further relates to a target plate for this device.

Such devices are used, for example, in equipment in which analogue signals are converted at very high frequencies (of the order of 10–100 MHz) into digital signals for further processing.

A device of the aforementioned kind is known from the article "Electron Beam Solves Problems of High Speed Digitizing" by R. Hayes, published in "Industrial Research and Development", Vol. 22, May 1980, p. 124–130. In this article, a digital converter (digitizer) for oscilloscopy is described.

The device shown there comprises an electron source, by means of which a flat electron beam is generated. After this beam, if required, has been subjected to some form corrections, it is passed between two deflection plates to which the analogue signal to be converted is supplied as a deflection voltage. After a deflection, if any, of the beam by this signal, this beam reaches a target plate which is provided with a plurality of radiation-sensitive diodes. These diodes are covered with a metal pattern which represents a given code, in this case the Gray code. Dependent upon the point at which the beam strikes the target plate, a larger or smaller number of radiation-sensitive diodes are struck by this electron beam and consequently become current-conducting. The signals originating from these diodes are compared with a reference level which lies approximately at a mean value between the signal originating from a fully irradiated diode and the signal originating from a non-irradiated diode. In this comparison, the signal is identified as a logic "1" or as a logic "0" and passed on for further processing in a digital circuit.

Since these devices are frequently used in fast oscilloscopy and other forms of signal processing in which a fast analogue-to-digital conversion takes place, it is important that this identification is realized as soon as possible.

The present invention has for its object to gain this end and consequently to achieve that such devices can be used at higher frequencies than the known analogue-to-digital converters.

A device according to the invention is therefore characterized in that the semiconductor body is provided at the main surface with a second set of radiation-sensitive semiconductor elements which are substantially completely covered with a second part substantially complementary to the first part of the pattern of material substantially opaque to radiation.

The expression "substantially complementary" is not to be understood herein to mean that parts of the first pattern are completely absent at the areas of corresponding parts of the second pattern. However, this expression is to be understood to mean that, where a radiation-sensitive diode or another radiation-sensitive semiconductor element is covered, for example, with a first metal pattern, the complementary diode generally for the greater part is at the corresponding area not covered with the metal pattern or covered with a much thinner metal pattern, and conversely.

The invention is based on the recognition of the fact that the simultaneous availability of a signal and the associated complementary signal permits a very fast processing of the signals because now instead of a circuit arrangement in which a signal is compared with a reference level a differential amplifier can be used to identify the signals originating from the radiation-sensitive semiconductor elements as "0" or "1" and to supply them to a processing unit. The signal originating from the target plate and the signal complementary to this signal are now in fact supplied to the inputs of the differential amplifier, which may be realized in the same semiconductor body, as a result of which a faster identification is accomplated (push-pull processing).

Besides, the digital signal originating from such a differential amplifier (and, if required, the complementary signal) may be supplied to several processing units, which causes an increase of the flexibility with respect to the data processing.

A low sensitivity to alignment errors of the plane of the electron beam with respect to the target plate can be obtained by disposing the pattern of material substantially opaque to radiation so that upon transition from a discrete state to a next discrete state signal variations occur only in one pair of radiation-sensitive semiconductor elements, for example, by using a pattern which is obtained by means of the Gray code.

A preferred embodiment of a device according to the invention is characterized in that at least one set of radiation-sensitive semiconductor elements covered with complementary parts of the pattern of material opaque to radiation is covered at at least one end of the pattern in an identical manner with this pattern or is left free at this area.

Thus, the maximum voltage which can be converted by the device into a digital signal can be detected in a simple manner.

For the mutual insulation of the radiation-sensitive semiconductor elements and any interposed other elements, such as, for example, protection diodes, use may be made of the principle described in the Netherlands Patent Application no. 8003906 laid open for public inspection on Feb. 1, 1982, and assigned to the same assignee (corresponding to U.S. continuation application Ser. No. 692,853, filed Jan. 16, 1985). This results in a considerable saving of space because the distance between these elements can then be chosen to be very small (of the order of 10 μm or less).

A target plate for use in a device according to the invention is characterized in that it comprises a semiconductor body having at a main surface a first and a second set of radiation-sensitive semiconductor elements which are covered with parts substantially complementary to each other of a pattern of material opaque to radiation.

The invention will now be described more fully with reference to a few embodiments and the drawing, in which:

FIG. 2 is a schematic plan view of a part of the metallization pattern of a target plate for use in such a device, while

The figures are schematic and not drawn to scale, while for the sake of clarity, in the cross-section in particular the dimensions in the direction of thickness are greatly exaggerated. Semiconductor zones of the same conductivity type are generally cross-hatched in the same direction; in the various embodiments, corresponding parts are generally designated by the same reference numbers.

Figure 1:
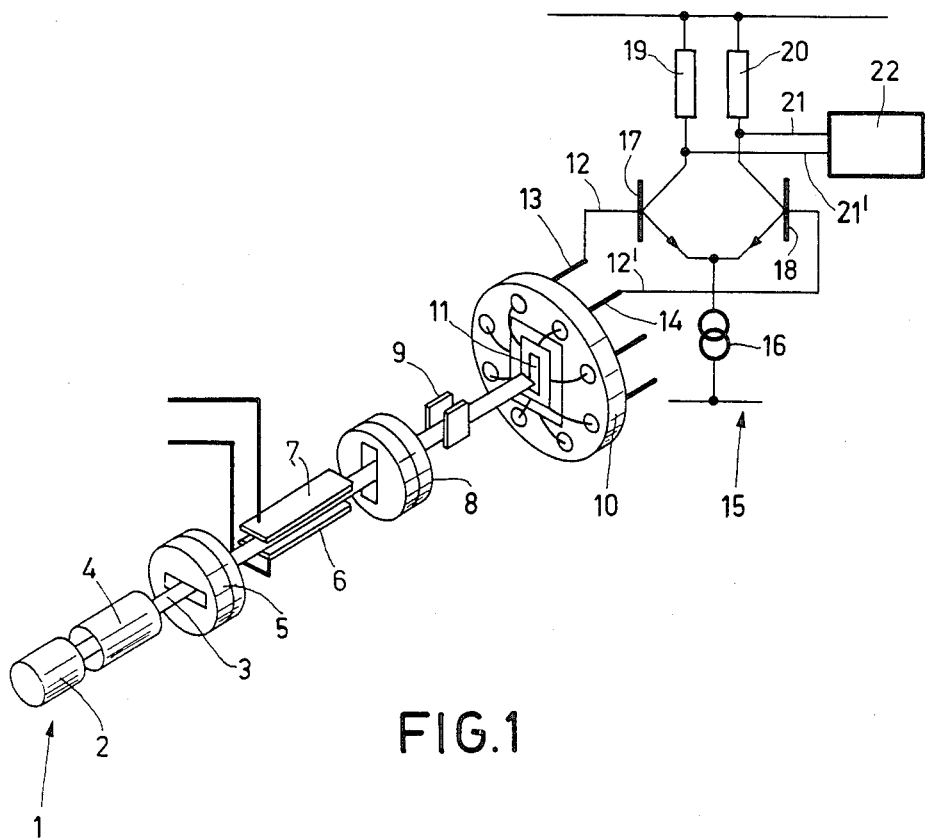
FIG. 1 shows diagrammatically a device according to the invention.

The device of FIG. 1 comprises a cathode 2, by means of which a flat electron beam 3 is generated. The cathode may be of the conventional type (hot cathodes), but is particular for generating a flat electron beam having a small thickness, the cold cathodes as described in the Netherlands Patent Application no. 7800987 laid open for public inspection on July 31, 1979 (corresponding to U.S. Pat. Nos. 4,259,678 and 4,325,084) and the Netherlands Patent Application no. 7905470 laid open for public inspection on Jan. 15, 1981 (corresponding to U.S. Pat. Nos. 4,303,930 and 4,370,797) both being assigned to the same assignee.

After the electrons forming part of the electron beam 3 have traversed an acceleration element 4 and an electron lens 5 for vertical focussing, they are deflected by the deflection electrodes 6, 7, to which an analogue voltage is supplied which has to be converted. After it has traversed a further horizontal focussing lens 8 and horizontal electrodes 9 for horizontal positioning, the electron beam 3 strikes a semiconductor device 11, which is mounted on a holder 10.

The semiconductor device 11 comprises a low-ohmic substrate 23 (see FIG. 3) of the n-conductivity type, on which an n-type epitaxial layer 24 is grown. In a first embodiment (FIG. 3), radiation-sensitive diodes constituted by the pn-junctions 35 between the epitaxial layer 24 and p-type surface layers 25 are provided. The distance between two p-type surface regions 25 is then chosen to be so small, for example, 10 μm, that, when a reverse voltage, which is at the same time the operating voltage, is applied across adjacent diodes, the epitaxial layer 24 can be substantially fully depleted between adjacent regions 25 by depletion regions 28 associated with the pn-junctions 35. By ensuring that these depletion regions are, as it were, contiguous to each other, the electric field lines deflect so that due to the prevailing electric field the charge carriers generated in the depletion region practically always move to the associated pn-junction and thus contribute to the current produced in this pn-junction. For a further description of this mechanism, reference is made to the above-mentioned Netherlands Patent Application no. 8003906 of the Applicant laid open for public inspection on Feb. 1, 1982.

Thus this previous patent application discloses a radiation-sensitive semiconductor device comprising a semiconductor body of silicon with the semiconductor body comprising a low-ohmic substrate on which an n-type epitaxial layer is provided in a thickness of approximately 10 micrometers and a resistivity in the order of 100-200 ohm centimeter. At a substantially flat surface of the structure, the semiconductor body has mutually separated rectifying junctions. For this purpose the semiconductor body at its surface has p-type surface regions which with the epitaxial layer form rectifying junctions (p-n junctions).

The p-n junctions can be reversely biased by means of an electric voltage and contacts on opposite sides of the semiconductor body. As a result of this, near each p-n junction in the epitaxial layer and the associated surface region, a depletion region is created. Electric field lines are provided as a result of electric fields prevailing in such depletion regions.

When light or radiation of a sufficiently high energy is incident on the surface of the semiconductor body (at least equal to the width of the forbidden band of the semiconductor material) extra charge carriers (holes and electrons) are generated in the semiconductor body. In the depletion regions the extra charge carriers are removed as a result of the prevailing field and so contribute to a photoelectric current through the associated p-n junction.

The distance between the surface regions of the p-type are so small that regions present between adjacent p-type surface regions can be depleted by depletion regions associated with these surface regions upon applying a reverse voltage across the radiation-sensitive diode.

With a mutual distance between the p-regions of approximately 4 micrometers a reverse voltage of approximately 8 volts across the adjoining p-n junctions is sufficient for the associated depletion regions in the epitaxial layer to contact each other as it were. At the area of the contact face of the depletion regions associated with juxtaposed p-n junctions, the electric field lines deflect in such a manner that as a result of the prevailing electric field the charge carriers generated in the depletion region move substantially always to the associated p-n junction. In this manner they contribute to the photoelectric current generated in the p-n junction.

The mutual distance between the p-type regions is many times smaller than in known radiation-sensitive devices so that a much better resolving power is obtained. In addition, the epitaxial layer is depleted over the greater part of its thickness so that, notably in the wavelength range from 400 to 1100 nanometers, substantially no contribution to the photoelectric current is applied by diffusion of generated charge carriers; and this makes the device considerably more rapid. In addition the semiconductor surface is sensitive to incident radiation over the entire region between the p-type surface regions. This means that very narrow beams can be detected.

The surface 26 is coated with an insulating layer 27 in which contact holes 36 are provided. By these contact holes, the subjacent p-type regions 25 are contacted by means of a metallization pattern of, for example, aluminium, which is shown partly in FIG. 2. At areas 29 (see FIGS. 2,3) this pattern completely covers the subjacent semiconductor body, whereas at areas 30 it leaves free the semiconductor body for the major part. In the present example, the patterns of two adjacent diodes are complementary, that is to say that substantially throughout the entire surface of two diodes, at adjacent parts, one diode is coated with the metal pattern and the adjacent part of the other diode is practically uncoated. When the target plate is now struck by the beam 3, as indicated, for example, in FIG. 2 at the area of the narrow band 34, a practically uncoated diode will become conducting, whereas the diodes coated with the metal layer 29 do not or substantially not conduct current; and these currents are converted with the aid of resistors or by other means into electric voltages. This gives rise to the occurrence of two complementary signals 12,12' at the signal terminals 13,14 of the semiconductor device 11, which signals are supplied to the input transistors 17,18 of the differential amplifier 15 shown diagrammatically. The differential amplifier 15 comprises a current source 16. Depending upon the value of the signals 12, 12', one of the two transistors 17,18 is conducting, which gives rise to a voltage drop across one of the two resistors 19,20. This voltage drop or the absence thereof gives rise to the occurrence of digital signals at the signal lines 21,21'. These signals are then supplied, if desired through emitter followers not shown in FIG. 1, to a digital processing unit 22.

Due to the fact that the current generated by the current source 16 is switched bilaterally with the aid of the complementary signals 12,12' which exhibit an opposite signal variation, this switching can be effected much more rapidly than in the case of a comparison of a single signal with a fixed reference value.

Figure 2:
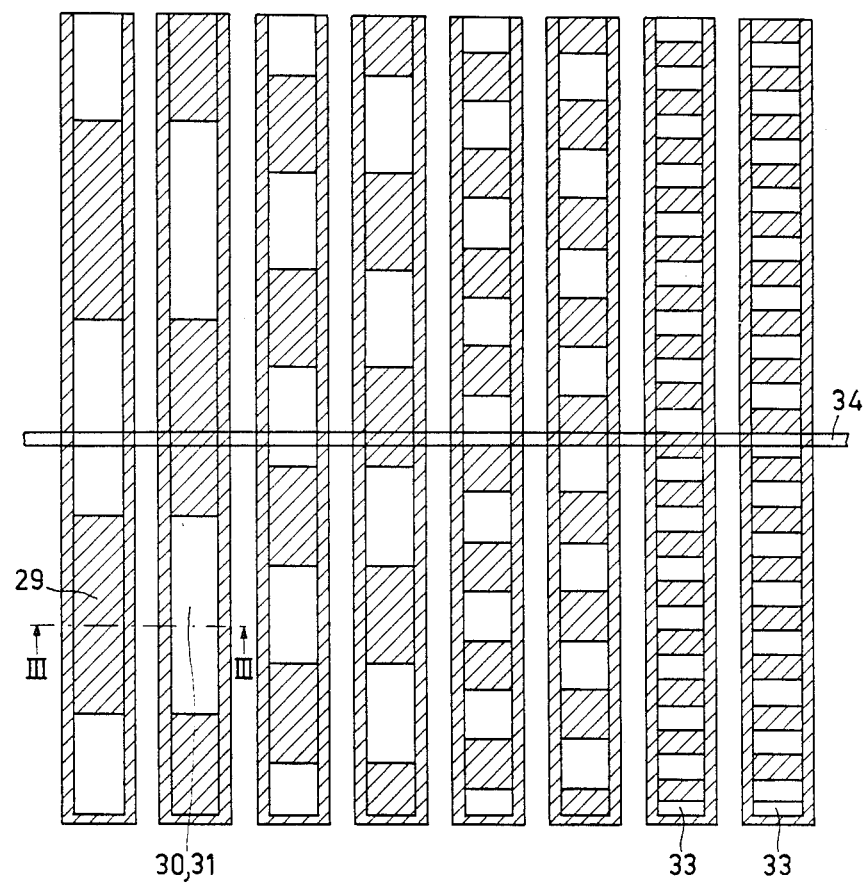

The metal pattern 29 in FIG. 2 is provided according to the Gray code and its complement. This has the advantage that, upon transition of one discrete state to another, signal variation occurs only in one set of complementary diodes; and this results in a more reliable operation of the device. Although only the metal pattern of four diodes and the associated complementary diodes is shown here, the number of diodes may of course be enlarged.

Figures 3, 4:
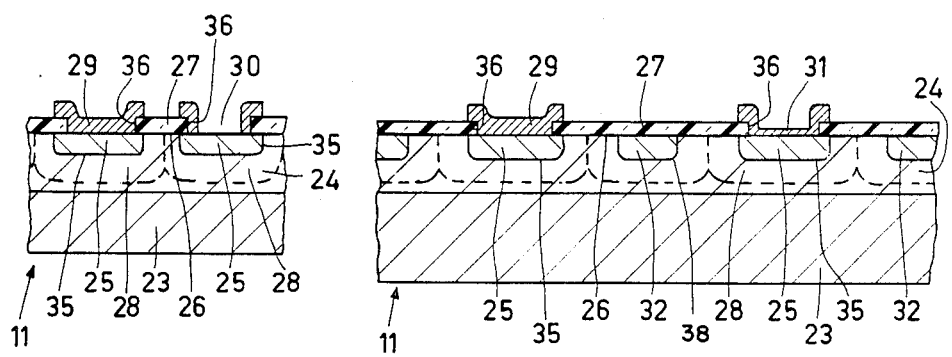
FIG. 3 shows diagrammatically a cross-section of the target plate taken on the line III—III in FIG. 2.
FIG. 4 shows diagrammatically an alternative embodiment of the device of FIG. 3.

In the arrangement of FIG. 4, additional p-type regions 32 are provided between the p-type surfaces 25 in the n-type epitaxial layer 24. The pn-junctions 38 thus obtained constitute protection diodes, which by the formation of electric surface fields limit to some extent the detrimental effect of incident X-ray radiation.

The complementary metal pattern in this example consists of parts which form part of the thick metallization pattern 29 and cover the surface completely in one diode, whereas at the area of corresponding parts of the complementary diodes, the surface is coated with a thin metal layer 31. This metal layer 31 is sufficiently thin to pass such a number of electrons that a current is generated in the subjacent diode when the diode is struck at the area of the thin layer 31 by the electron beam 3. In the operating condition, the radiation-sensitive diodes and the protection diodes are again biassed in the reverse direction so that the depletion zones associated with adjacent pn-junctions 35,38 are contiguous to each other.

The metal patern shown in FIG. 2 in one set of diodes is not coated with metal in one of its ends, denoted by the reference numeral 33. Thus, it is achieved that, when the beam 3,34 strikes these ends, the associated complementary diodes both are conducting current and the differential amplifier does not supply a defined signal. In this manner, it can be detected when the electron beam strikes the end of the target plate and the analogue-to-digital converter has reached the limit above which signals can no longer be converted into digital values. The same effect is obtained when both diodes are covered with a thick metal layer at the area of the ends denoted by the reference numeral 33.

It goes without saying that the invention is not limited to the aforementioned examples, but that various modifications are possible within the scope of the invention for those skilled in the art. For example, where now the ends 33 are uncovered in only one pair of complementary diodes, the ends of several pairs of complementary diodes may remain uncoated. Furthermore, it is not necessary, as in FIGS. 2,3, for two complementary diodes to be located directly beside each other, but, for example, a set of diodes covered with a mask according to a Gray-code pattern, may be located on one side of the target plate and a set of diodes covered with the complementary pattern may be located on the other side, while combined forms are also possible. In particular when the diodes on which the finest structure of the pattern 29 is provided, are located on the two extreme sides, the aforementioned insensitivity to alignment errors of the electron beam has an optimum value.

Instead of by leaving, as the case may be, the ends of the diodes covered or uncovered in the same manner, the signals indicating the end or the beginning of the signal range may alternatively be derived from diodes located outside the drawing of FIG. 2, which may additionally be used, for example, for calibration purposes.

Other radiation-sensitive elements, such as radiation-sensitive transistors, may also be used. Furthermore, the conductivity type of the regions 32 may be chosen to be equal to that of the epitaxial layer; with a sufficiently high doping, these regions then serve as channel stoppers. Finally, other materials, such as, for example, a thick oxide layer, may be chosen for the pattern 29.

Moreover, as already stated, the differential amplifier 15 and, as the case may be, elements of the processing unit 22, may be incorporated in the same semiconductor body in which the target plate is realized.

What is claimed is:

1. A device for converting an analog input signal into corresponding digital signals comprising
    source means for generating a flat electron beam,
    deflection means for deflecting said electron beam depending on an analog input signal,
    target means for receiving the deflected electron beam, said target means comprising
    a semiconductor body having a main surface,
    a first set of radiation-sensitive semiconductor elements at said main surface, said first set of semiconductor elements being covered with a first portion of a pattern, said pattern being of a material substantially opaque to radiation, and
    a second set of radiation-sensitive semiconductor elements at said main surface, said second set of semiconductor elements being substantially completely covered with a second portion of said pattern, said second portion being substantially complementary to said first portion of said pattern,
    wherein said radiation-sensitive semiconductor elements produce a number of digital signals, said digital signals representing a number of discrete states of said analog input signal.

2. A device according to claim 1, wherein signals originating from said first and second sets of radiation-sensitive semiconductor elements are supplied to complementary inputs of a differential amplifier, said differential amplifier supplying at least one digital signal to a processing unit.

3. A device according to claim 1 or claim 2, wherein said pattern is provided to form signal variations in only one pair of said first and second semiconductor elements upon transition of one discrete state to a next discrete state.

4. A device according to claim 3, wherein said first and second portions of said pattern corresponds to "0" positions of the Gray Code and its complement.

5. A device according to claim 1 or claim 2, wherein at least one pair of said first and second sets is free of said pattern at least at one end of said pair.

6. A device according to claim 1, wherein at least one pair of said first and second sets is covered with said pattern at least at one end of said pair.

7. A device according to claim 1 or claim 2, wherein said pattern comprises a metal pattern.

8. A device according to claim 1 or claim 2, wherein said semiconductor body includes at least one protection diode at said main surface, said protection diode being disposed between at least two radiation-sensitive semiconductor elements of each of said first and second sets.

9. A device according to claim 8, wherein said radiation-sensitive semiconductor elements of each of said first and second sets comprise radiation-sensitive diodes.

10. A device according to claim 4, wherein said radiation-sensitive diodes are separated by a distance of at most 10 $\mu$m.

11. A device according to claim 1 or claim 2, wherein said radiation-sensitive semiconductor elements of each of said first and second sets comprise radiation-sensitive diodes.

12. A device according to claim 11, wherein said radiation-sensitive diodes are separated by a distance of at most 10 $\mu$m.

13. A target plate for use in an analog-to-digital device comprising
a semiconductor body having a main surface,
a first set of radiation-sensitive semiconductor elements at said main surface,
a second set of radiation-sensitive semiconductor elements at said main surface, and
a pattern of material substantially opaque to radiation covering said first and second sets,
said pattern having first parts covering said first set substantially complementary to second parts covering said second set.

14. A target plate according to claim 13, wherein said first and second parts of said pattern correspond to "0" positions of the Gray Code and its compliment.

15. A target plate according to claim 13 or claim 14, wherein at least one pair of said first and second sets of radiation-sensitive semiconductor elements is free of said pattern at least at one end of said pair.

16. A target plate according to claim 13 or claim 14, wherein at least one pair of said first and second sets of radiation-sensitive semiconductor elements is covered with said pattern at least at one end of said pair.

17. A target plate according to claim 13 or claim 14, wherein said pattern comprises a metal pattern.

18. A target plate according to claim 13 or claim 14, wherein said semiconductor body includes at least one protection diode at said main surface, said protection diode being disposed between at least two semiconductor elements of each of said first and second sets.

19. A target plate according to claim 13 or claim 14, wherein said semiconductor elements of each of said first and second sets comprise radiation-sensitive diodes.

20. A target plate according to claim 19, wherein said radiation-sensitive diodes are separated by a distance of at most 10 $\mu$m.

* * * * *